US011387257B2

(12) United States Patent
Gu et al.

(10) Patent No.: US 11,387,257 B2
(45) Date of Patent: Jul. 12, 2022

(54) ARRAY SUBSTRATE AND MANUFACTURING METHOD THEREOF, DISPLAY PANEL AND DISPLAY DEVICE

(71) Applicant: BOE Technology Group Co., Ltd., Beijing (CN)

(72) Inventors: Pengfei Gu, Beijing (CN); Youngsuk Song, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 350 days.

(21) Appl. No.: 16/498,726

(22) PCT Filed: Apr. 1, 2019

(86) PCT No.: PCT/CN2019/080834
§ 371 (c)(1),
(2) Date: Sep. 27, 2019

(87) PCT Pub. No.: WO2019/192429
PCT Pub. Date: Oct. 10, 2019

(65) Prior Publication Data
US 2021/0358964 A1 Nov. 18, 2021

(30) Foreign Application Priority Data
Apr. 3, 2018 (CN) .......................... 201810288924.4

(51) Int. Cl.
*H01L 33/00* (2010.01)
*H01L 27/12* (2006.01)
*H01L 27/28* (2006.01)

(52) U.S. Cl.
CPC ...... *H01L 27/1218* (2013.01); *H01L 27/1262* (2013.01); *H01L 27/1288* (2013.01); *H01L 27/283* (2013.01)

(58) Field of Classification Search
CPC ............ H01L 27/1218; H01L 27/1262; H01L 27/1288; H01L 27/283; H01L 27/1229;
(Continued)

(56) References Cited

U.S. PATENT DOCUMENTS 9,536,934 B2   1/2017  Kang
9,768,200 B2   9/2017  Lv et al.
(Continued)

FOREIGN PATENT DOCUMENTS

CN   102005413 A   4/2011
CN   103715226 A   4/2014
(Continued)

OTHER PUBLICATIONS

Feb. 25, 2020—(CN) First Office Action Appn 201810288924.4 with English Translation.

(Continued)

*Primary Examiner* — Abdul-Samad A Adediran
(74) *Attorney, Agent, or Firm* — Banner & Witcoff, Ltd.

(57) ABSTRACT

An array substrate and a manufacturing method thereof, a display panel and a display device are provided. The array substrate includes: a base substrate including a driving thin film transistor region and a switching thin film transistor region; and a buffer layer containing oxygen, the buffer layer including a first buffer part located in the driving thin film transistor region and a second buffer part located in the switching thin film transistor region; the first buffer part has a first thickness, the second buffer part has a second thickness, and the second thickness is greater than the first thickness.

4 Claims, 4 Drawing Sheets

(58) Field of Classification Search
CPC .......... H01L 29/78645; H01L 27/3258; H01L 27/1251
USPC .............................................. 257/59, 72, 98
See application file for complete search history.

(56) References Cited

U.S. PATENT DOCUMENTS

| | | | |
|---|---|---|---|
| 10,559,639 | B2 | 2/2020 | Shi |
| 2007/0262314 | A1* | 11/2007 | Noguchi ........... H01L 29/78645 257/72 |
| 2008/0035926 | A1* | 2/2008 | Toyota ................ H01L 27/1229 257/59 |
| 2009/0261337 | A1* | 10/2009 | Sakakura .............. H01L 27/283 257/72 |
| 2012/0098008 | A1* | 4/2012 | Song .................. H01L 27/3258 257/98 |
| 2016/0307929 | A1 | 10/2016 | Zhang |
| 2017/0250207 | A1 | 8/2017 | Wang et al. |
| 2017/0287946 | A1 | 10/2017 | Hiromasu et al. |
| 2018/0175077 | A1* | 6/2018 | Koo .................... H01L 27/1251 |

FOREIGN PATENT DOCUMENTS

| | | |
|---|---|---|
| CN | 104241298 A | 12/2014 |
| CN | 104900532 A | 9/2015 |
| CN | 108364963 A | 8/2018 |
| KR | 20170081060 A | 7/2017 |
| WO | 2018040379 A1 | 3/2018 |

OTHER PUBLICATIONS

Sep. 3, 2020—(CN) Second Office Action Appn 201810288924.4 with English Translation.

* cited by examiner

S41 — forming a buffer layer on the base substrate, the base substrate including a driving thin film transistor region and a switching thin film transistor region, the buffer layer containing oxygen, the buffer layer including a first buffer part located in the driving thin film transistor region and a second buffer part located in the switching thin film transistor region, the first buffer part having a first thickness, the second buffer part having a second thickness, the second thickness being greater than the first thickness S42 — forming a first semiconductor active layer of a driving TFT on the first buffer part, and forming the second semiconductor active layer of a switching TFT on the second buffer part S43 — performing an annealing process on the base substrate on which the first buffer part, the second buffer part, the first semiconductor active layer and the second semiconductor active layer are formed

FIG. 4A

S401 — coating a buffer film layer that contains oxygen on the base substrate and coating a photoresist thin film on the buffer film layer S402 — performing an exposure process, a development process on the photoresist thin film by a patterning process to form a photoresist-partially-removed part, a photoresist-completely-retained part and a photoresist-completely-removed region, the photoresist-partially-removed part being located in the driving thin film transistor region, the photoresist-completely-retained part being located in the switching thin film transistor region S403 — removing a part of the buffer film layer under the photoresist-partially-removed part to form the first buffer part, the first buffer part having a first thickness S404 — removing remaining photoresist of the photoresist-completely-retained part to form the second buffer part, the second buffer part having a second thickness, and the second thickness being greater than the first thickness

FIG. 4B

ARRAY SUBSTRATE AND MANUFACTURING METHOD THEREOF, DISPLAY PANEL AND DISPLAY DEVICE

CROSS-REFERENCE TO RELATED APPLICATIONS

The application is a U.S. National Phase Entry of International Application No. PCT/CN2019/080834 filed on Apr. 1, 2019, designating the United States of America and claiming priority to Chinese Patent Application No. 201810288924.4, filed on Apr. 3, 2018. The present application claims priority to and the benefit of the above-identified applications and the above-identified applications are incorporated by reference herein in their entirety.

TECHNICAL FIELD

Embodiments of the present disclosure relate to an array substrate and a manufacturing method thereof, a display panel and a display device.

BACKGROUND

A display device includes a thin film transistor (TFT). The display device includes a liquid crystal display. Each of pixel points on the liquid crystal display is driven by a thin film transistor integrated therein, so that screen information can be displayed at a high speed, a high brightness and a high contrast. A thin film transistor-liquid crystal display (TFT-LCD) is one of the liquid crystal displays.

SUMMARY

Embodiments of the present disclosure provide an array substrate and a manufacturing method thereof, a display panel and a display device, in order to solve the problem that electrical characteristics of thin film transistors located in different regions cannot be simultaneously satisfied on the same array substrate in an existing art.

At least one embodiment of the present disclosure provide an array substrate, which includes: a base substrate and a buffer layer, the base substrate includes a driving thin film transistor region and a switching thin film transistor region; the buffer layer contains oxygen, the buffer layer includes a first buffer part located in the driving thin film transistor region and a second buffer part located in the switching thin film transistor region; the first buffer part has a first thickness, the second buffer part has a second thickness, and the second thickness is greater than the first thickness.

In one or more embodiments of the present disclosure, the array substrate further includes a driving thin film transistor located in the driving thin film transistor region and a switching thin film transistor located in the switching thin film transistor region; the driving thin film transistor includes a first semiconductor active layer, the switching thin film transistor includes a second semiconductor active layer, the first semiconductor active layer is in contact with the first buffer part, and the second semiconductor active layer is in contact with the second buffer part.

In one or more embodiments of the present disclosure, both the driving thin film transistor and the switching thin film transistor are located at a side of the buffer layer away from the base substrate.

In one or more embodiments of the present disclosure, the driving thin film transistor further includes a first insulating part and a first gate electrode that are located at a side of the first semiconductor active layer away from the base substrate, the switching thin film transistor further includes a second insulating part and a second gate electrode that are located at a side of the second semiconductor active layer away from the base substrate, an orthographic projection of the first insulating part on the base substrate coincides with an orthographic projection of the first gate electrode on the base substrate, and an orthographic projection of the second insulating part on the base substrate coincides with an orthographic projection of the second gate electrode on the base substrate.

In one or more embodiments of the present disclosure, the driving thin film transistor further includes a first source electrode and a first drain electrode, the switching thin film transistor further includes a second source electrode and a second drain electrode, the first source electrode and the first drain electrode are connected with the first semiconductor active layer, respectively, and the second source electrode and the second drain electrode are connected with the second semiconductor active layer, respectively.

In one or more embodiments of the present disclosure, the array substrate further includes an interlayer insulating layer, the interlayer insulating layer is located between any two of the first gate electrode, the first source electrode and the first drain electrode, and is located between any two of the second gate electrode, the second source electrode and the second drain electrode.

In one or more embodiments of the present disclosure, a material of the buffer layer includes $SiO_x$, where x is a positive number.

In one or more embodiments of the present disclosure, the first thickness is in a range from 1000 Å to 1500 Å, and the second thickness is in a range from 3000 Å to 4500 Å.

In one or more embodiments of the present disclosure, the first semiconductor active layer includes an oxide semiconductor active layer, and the second semiconductor active layer includes an oxide semiconductor active layer.

At least one embodiment of the present disclosure further provides a display panel, which includes the array substrate provided by any one of the above embodiments.

At least one embodiment of the present disclosure further provides a display device, which includes the display panel provided by any one of the above embodiments.

At least one embodiment of the present disclosure further provides a manufacturing method of an array substrate, which includes: forming a buffer layer on a base substrate; the base substrate including a driving thin film transistor region and a switching thin film transistor region, the buffer layer containing oxygen, the buffer layer including a first buffer part located in the driving thin film transistor region and a second buffer part located in the switching thin film transistor region, the first buffer part having a first thickness, the second buffer part having a second thickness, and the second thickness being greater than the first thickness; forming a first semiconductor active layer of a driving thin film transistor on the first buffer part, and forming a second semiconductor active layer of a switching thin film transistor on the second buffer part; and performing an annealing process on the base substrate on which the first buffer part, the second buffer part, the first semiconductor active layer and the second semiconductor active layer are formed.

In one or more embodiments of the present disclosure, forming the buffer layer on the base substrate includes: coating a buffer film layer on the base substrate, coating a photoresist thin film on the buffer film layer; performing an exposure process and a development process on the photoresist thin film by a patterning process to form a photoresistpartially-removed part, a photoresist-completely-retained part and a photoresist-completely-removed region; the photoresist-partially-removed part being located in the driving thin film transistor region, the photoresist-completely-retained part being located in the switching thin film transistor region; removing a part of the buffer film layer under the photoresist-partially-removed part to form the first buffer part; and removing remaining photoresist of the photoresist-completely-retained part to form the second buffer part.

In one or more embodiments of the present disclosure, performing the exposure process on the photoresist thin film by the patterning process includes: performing the exposure process on the photoresist thin film with a gray-tone mask or a half-tone mask.

In one or more embodiments of the present disclosure, removing the part of the buffer film layer under the photoresist-partially-removed part includes: performing a first etching process on the buffer film layer by using the photoresist-completely-retained part and the photoresist-partially-removed part as a mask; performing an ashing process on the photoresist-completely-retained part and the photoresist-partially-removed part to remove a part of the photoresist-completely-retained part and to remove the photoresist-partially-removed part; and performing a second etching process on the buffer film layer by using a remaining part of the photoresist-completely-retained part as a mask to remove a part of the buffer film layer to form the first buffer part.

In one or more embodiments of the present disclosure, the method further includes: forming a first insulating part, a first gate electrode, a first source electrode and a first drain electrode of the driving thin film transistor that are located at a side of the first semiconductor active layer away from the base substrate; forming a second insulating part, a second gate electrode, a second source electrode and a second drain electrode of the switching thin film transistor that are located at a side of the second semiconductor active layer away from the base substrate; forming an interlayer insulating layer and forming a first via hole, a second via hole, a third via hole and a fourth via hole that penetrate the interlayer insulating layer; the interlayer insulating layer is located between any two of the first gate electrode, the first source electrode and the first drain electrode, and is located between any two of the second gate electrode, the second source electrode and the second drain electrode; the first source electrode and the first drain electrode are connected with the first semiconductor active layer through the first via hole and the second via hole, respectively; and the second source electrode and the second drain electrode are connected with the second semiconductor active layer through the third via hole and the fourth via hole, respectively.

BRIEF DESCRIPTION OF THE DRAWINGS

Hereinafter, the drawings accompanying embodiments of the present disclosure are simply introduced in order to more clearly explain technical solution(s) of the embodiments of the present disclosure. Obviously, the described drawings below are merely related to some of the embodiments of the present disclosure without constituting any limitation thereto.

FIG. 4A is a flowchart illustrating a manufacturing method of an array substrate provided by an embodiment of the present disclosure;

FIG. 4B is a flowchart illustrating a manufacturing method of an array substrate provided by an embodiment of the present disclosure;

DETAILED DESCRIPTION

In order to make objectives, technical details and advantages of the embodiments of the present disclosure apparent, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the described object is changed, the relative position relationship may be changed accordingly.

Generally, it is necessary to provide regions having different thin film transistor characteristics on the same array substrate, respectively. For example, a driving thin film transistor region and a switching thin film transistor region are provided. A thin film transistor in the driving thin film transistor region should have a characteristic on better stability under positive-bias temperature stress (PBTS) condition to achieve a stable display effect. The thin film transistor in the switching thin film transistor region should have a characteristic on better stability under negative-bias illumination temperature stress (NBITS) condition so as to provide a better switching control performance.

Through studying on array substrate, the inventor(s) of the present application found that a thin film transistor located in the driving thin film transistor region and a thin film transistor located in the switching thin film transistor region that are arranged on the same substrate have the same electrical characteristics cannot simultaneously satisfy requirements on the electrical characteristics of thin film transistors in different regions.

Figure 1:
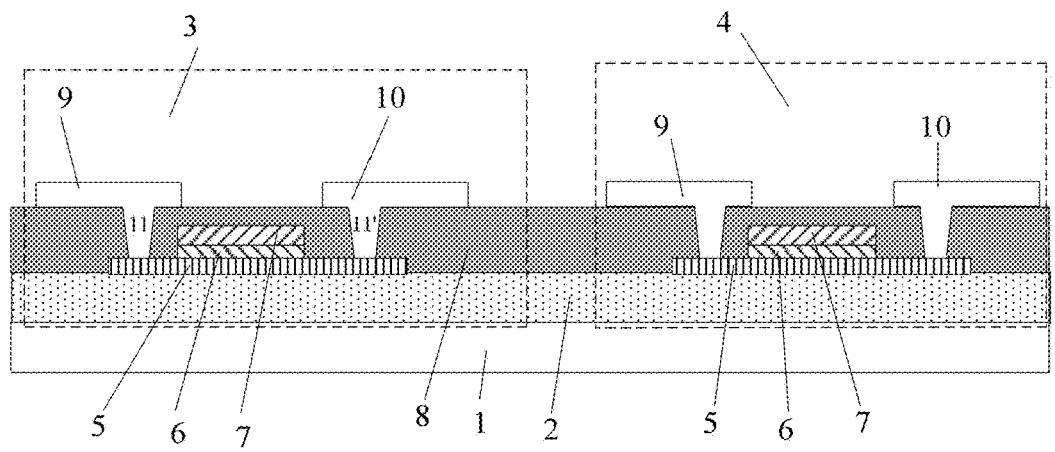
FIG. 1 is a schematic diagram illustrating a structure of an array substrate.

FIG. 1 is a schematic diagram illustrating a structure of an array substrate. As illustrated in FIG. 1, the array substrate includes a base substrate 1. The base substrate 1 includes a driving thin film transistor region 3 and a switching thin film transistor region 4. A buffer layer 2, a semiconductor active layer 5, an insulating layer 6, a gate electrode 7, an interlayer insulating layer 8, a source electrode 9 and a drain electrode 10 are all sequentially provided on the base substrate 1 of the driving thin film transistor region 3 and the switching thin film transistor region 4, respectively. The source electrode 9 is electrically connected with the semiconductor active layer 5 at a corresponding position through a first via hole 11. The drain electrode 10 is electrically connected with the semiconductor active layer 5 at a corresponding position through a second via hole 11'. A driving thin film transistor 01 includes the semiconductor active layer 5, the insulating layer 6, the gate electrode 7, the interlayer insulating layer 8, the source electrode 9 and the drain electrode 10 that are located in the driving thin film transistor region 3. A switching thin film transistor 02 includes the semiconductor active layer 5, the insulating layer 6, the gate electrode 7, the interlayer insulating layer 8, the source electrode 9 and the drain electrode 10 that are located in the switching thin film transistor region 4.

Through research, the inventor(s) found that the driving thin film transistor in the driving thin film transistor region 3 and the switching thin film transistor in the switching thin film transistor region 4 can have different electrical characteristics by adjusting oxygen content in at least one of the insulating layer 6 and the buffer layer 2. That is, the characteristics of the TFT can be adjusted by adjusting the oxygen content of an insulating layer containing oxygen that is in contact with the TFT.

The inventor(s) found that reducing the oxygen content of at least one of the insulating layer 6 and the buffer layer 2 is advantageous to obtain the TFT having better characteristic under PBTS condition. However, at the same time, the characteristic on illumination stability of the TFT under NBITS condition will deteriorate. Conversely, increasing the oxygen content of at least one of the insulating layer 6 and the buffer layer 2 deteriorates the characteristic of the TFT under PBTS condition, but is advantageous for the characteristic on illumination stability of the TFT under NBITS condition.

The inventor(s) found that the oxygen content cannot be simultaneously reduced or increased on the same insulating layer 6 or the same buffer layer 2 illustrated in FIG. 1. In the case where the electrical characteristics of the driving thin film transistor located in the driving thin film transistor region and the switching thin film transistor located in the switching thin film transistor region that are arranged on the same array substrate are the same cannot simultaneously satisfy the requirements of the electrical characteristics of TFTs located in different regions.

Embodiments of the present disclosure will be described in detail below with reference to the accompanying drawings.

Figure 2:
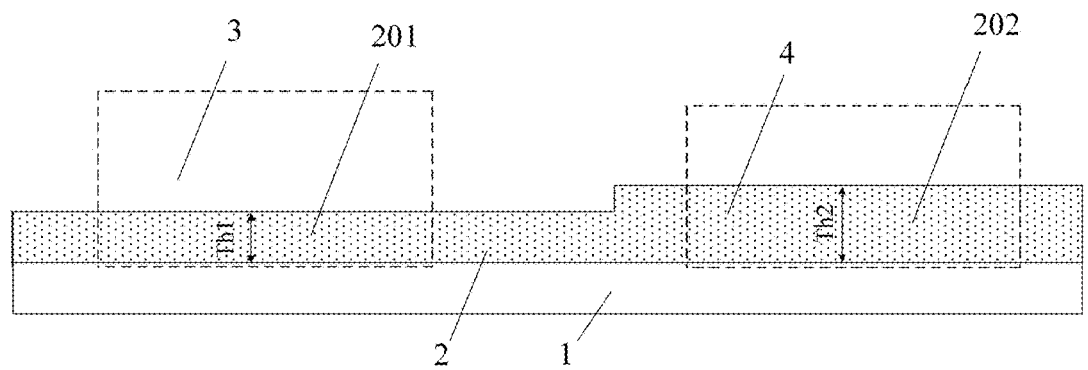
FIG. 2 is a schematic diagram illustrating a part of a structure of an array substrate provided by an embodiment of the present disclosure.

FIG. 2 is a schematic diagram illustrating a structure of an array substrate provided by an embodiment of the present disclosure. As illustrated in FIG. 2, the array substrate includes a base substrate 1. The base substrate 1 includes a driving thin film transistor region 3 and a switching thin film transistor region 4. The array substrate further includes a buffer layer 2 located on the base substrate 1. The buffer layer 2 contains oxygen. A part 201 of the buffer layer 2 in the driving thin film transistor region 3 has a first thickness Th1. A part 202 of the buffer layer 2 in the switching thin film transistor region 4 has a second thickness Th2. The second thickness Th2 is greater than the first thickness Th1. For example, the buffer layer 2 is made of the same material everywhere.

In the array substrate provided by the embodiments of the present disclosure, because a part of the buffer layer in the driving thin film transistor region and a part of the buffer layer in the switching thin film transistor region have different thicknesses, and the buffer layer in the embodiments of the present disclosure is a buffer layer that contains oxygen. The thicker the buffer layer is, the higher the oxygen content is. In the embodiments of the present disclosure, because a part of the buffer layer in the driving thin film transistor region has a first thickness, and a part of the buffer layer in the switching thin film transistor region has a second thickness, the second thickness is greater than the first thickness, that is, in the embodiments of the present disclosure, the part 201 of the buffer layer 2 in the driving thin film transistor region 3 has less oxygen content, and the part 202 of the buffer layer 2 in the switching thin film transistor region 4 has large oxygen content. That is, the oxygen content of the part 201 of the buffer layer 2 in the driving thin film transistor region 3 is less than the oxygen content of the part 202 of the buffer layer 2 in the switching thin film transistor region 4. Compared with the array substrate illustrated in FIG. 1, a display device that includes the array substrate provided by the embodiments of the present disclosure can provide a better display effect, and can further provide a better control performance, thereby improving an overall performance of both the array substrate and the display device.

The driving thin film transistor in the driving thin film transistor region 3 is not illustrated in FIG. 2, and the switching thin film transistor in the switching thin film transistor region 4 is not illustrated either.

For example, in an embodiment, the base substrate 1 is a glass substrate, without limited thereto. The base substrate 1 may further be substrates in other types.

Figure 3:
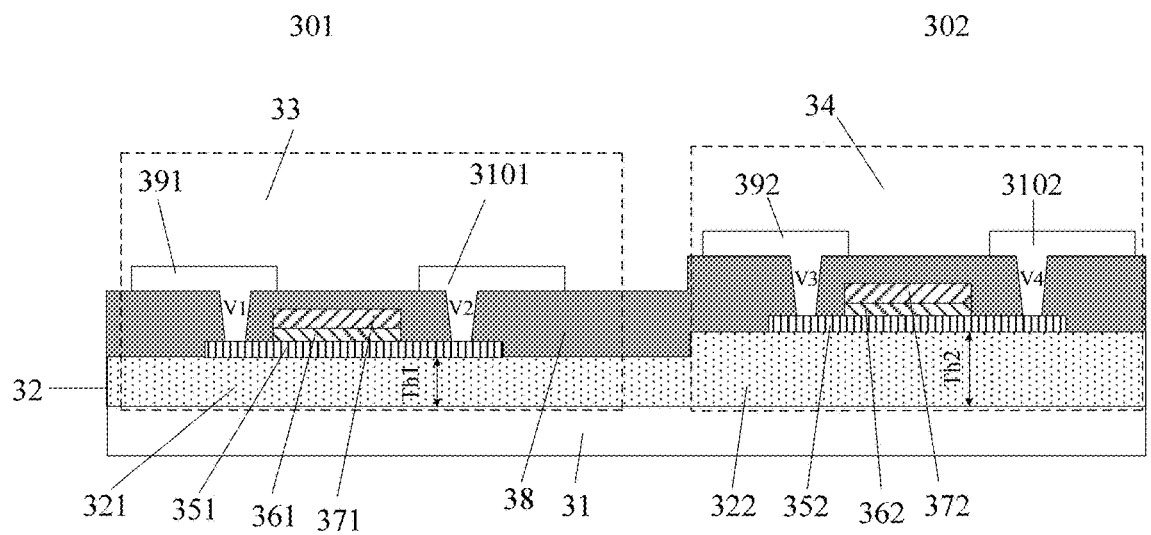
FIG. 3 is a schematic diagram illustrating a structure of an array substrate provided by an embodiment of the present disclosure.

FIG. 3 is a schematic diagram illustrating a structure of an array substrate provided by an embodiment of the present disclosure. As illustrated in FIG. 3, the array substrate 300 includes a base substrate 31 and a buffer layer 32 located on the base substrate 31. The buffer layer 32 contains oxygen. The array substrate 300/the base substrate 31 includes a driving thin film transistor region 33 and a switching thin film transistor region 34. The buffer layer 32 includes a first buffer part 321 located in the driving thin film transistor region 33 and a second buffer part 322 located in the switching thin film transistor region 34. The first buffer part 321 has a first thickness Th1. The second buffer part 322 has a second thickness Th2. The first thickness Th1 is less than the second thickness Th2. As illustrated in FIG. 3, a driving thin film transistor 301 is located in the driving thin film transistor region 33 and is located on the first buffer part 321. A switching thin film transistor 302 is located in the switching thin film transistor region 34 and is located on the second buffer part 322. The driving thin film transistor 301 includes a first semiconductor active layer 351, a first insulating part 361, a first gate electrode 371, an interlayer insulating layer 38, a first source electrode 391 and a first drain electrode 3101. The switching thin film transistor 302 includes a second semiconductor active layer 352, a second insulating part 362, a second gate electrode 372, the interlayer insulating layer 38, a second source electrode 392 and a second drain electrode 3102. For example, the interlayer insulating layer 38 is located between any two of the gate electrode 371, the source electrode 391 and the drain electrode 3101, and is located between any two of the second gate electrode 372, the second source electrode 392 and the second drain electrode 3102.

As illustrated in FIG. 3, the first source electrode 391 is electrically connected with the first semiconductor active layer 351 through a first via hole V1 that penetrates the interlayer insulating layer 38. The first drain electrode 392 is electrically connected with the second semiconductor active layer 352 through a second via hole V2 that penetrates the interlayer insulating layer 38. The second source electrode 392 is electrically connected with the second semiconductor active layer 352 through a third via hole V3 that penetrates the interlayer insulating layer 38. The second drain electrode 3102 is electrically connected with the second semiconductor active layer 352 through a fourth via hole V4 that penetrates the interlayer insulating layer 38.

The array substrate provided by the embodiments of the present disclosure is employed to control the oxygen contents of the first semiconductor active layer 351 and the second semiconductor active layer 352 that are located in different regions by using the buffer layer 32 having different thicknesses that is located in different regions. For example, the first semiconductor active layer 351 and the second semiconductor active layer 352 in the embodiments of the present disclosure are oxide semiconductor active layers. For example, materials of the first semiconductor active layer 351 and the second semiconductor active layer 352 include indium gallium zinc oxide (IGZO), without limited thereto. The buffer layer 32 has different thicknesses in different regions and has different oxygen diffusion abilities to the first semiconductor active layer 351 and the second semiconductor active layer 352 under an annealing process of a subsequent stage. The thicker the buffer layer 32 is, the higher the oxygen content is. For example, the first semiconductor active layer 351 and the second semiconductor active layer 352 may be made of the same material.

In the embodiments of the present disclosure, a part of the buffer layer 32 (the first buffer part 321) that is located in the switching thin film transistor region 4 is thicker, so that the second semiconductor active layer 352 of the switching thin film transistor 302 can reach a high oxygen state, thereby increasing the stability of the switching thin film transistor 302 under NBITS condition. A part of the buffer layer 32 (the second buffer part 322) that is located in the driving thin film transistor region 3 is thin, so that the driving thin film transistor 301 is in a low oxygen-containing state relative to the switching thin film transistor 302, thereby increasing the stability of the driving thin film transistor 301 under PBTS condition. Therefore, the electrical characteristics of the switching thin film transistor 302 and the driving thin film transistor 301 provided by the embodiments of the present disclosure can be quite different without adding process, so as to meet different application requirements.

For example, the buffer layer 32 is made of an oxygen-containing material. For example, in the present embodiment, the buffer layer 32 is made of a material of silicon oxide (SiOx, where x is a positive number). When the buffer layer 32 has the first thickness Th1 and the second thickness Th2 at different positions, due to the difference of thicknesses, the oxygen content of the buffer layer 32 having the second thickness is higher than that of the buffer layer 32 having the first thickness.

For example, the first thickness Th1 is in a range from 1000 Å to 1500 Å. The second thickness Th2 is in a range from 3000 Å to 4500 Å, without limited thereto. For further example, the first thickness Th1 is 1000 Å, and the second thickness Th2 is 3500 Å, without limited thereto.

As illustrated in FIG. 3, the first semiconductor active layer 351 of the driving thin film transistor 301 and the second semiconductor active layer 352 of the switching thin film transistor 302 are in contact with the buffer layer 2, respectively. As illustrated in FIG. 3, the first semiconductor active layer 351 is in contact with the first buffer part 321 having the first thickness Th1, and the second semiconductor active layer 352 is in contact with the second buffer part 322 having the second thickness Th2. A TFT may include a semiconductor active layer, a gate electrode, a source electrode and a drain electrode, and may further include other structures as needed.

TFT includes a TFT of top-gate structure and a TFT of bottom-gate structure. In the TFT of top-gate structure, the gate electrode is located at a side of the semiconductor active layer away from the base substrate. In the TFT of bottom-gate structure, the gate electrode is located at a side of the semiconductor active layer close to the base substrate. FIG. 3 is described with reference to the case where the driving TFT 301 is of the top-gate structure and the switching TFT 302 is of the top-gate structure, by way of example, without limited thereto. In other embodiments of the present disclosure, the driving TFT 301 and the switching TFT 302 may also adopt the bottom-gate structure.

TFT includes a TFT of top-contact structure and a TFT of bottom-contact structure. In the TFT of top-contact structure, the source electrode and the drain electrode are provided at a side of the semiconductor active layer away from the base substrate. In the TFT of bottom-contact structure, the source electrode and the drain electrode are provided at a side of the semiconductor active layer close to the base substrate. FIG. 3 is described with reference to the case where the driving TFT 301 is of the top-contact structure and the switching TFT 302 is of the top-contact structure, by way of example, without limited thereto. In other embodiments of the present disclosure, the driving TFT 301 and the switching TFT 302 may also adopt the bottom-contact structure.

As illustrated in FIG. 3, in order to be conveniently manufactured, the first insulating part 361 and the first gate electrode 371 have the same pattern. That is, an orthographic projection of the first insulating part 361 on the base substrate 31 coincides with an orthographic projection of the first gate electrode 371 on the base substrate 31, without limited thereto. In other embodiments, the first insulating part 361 and the first gate electrode 371 have different patterns.

As illustrated in FIG. 3, in order to be conveniently manufactured, the second insulating part 362 and the second gate electrode 372 have the same pattern. That is, an orthographic projection of the second insulating part 362 on the base substrate 31 coincides with an orthographic projection of the second gate electrode 372 on the base substrate 31, without limited thereto. In other embodiments, the second insulating part 362 and the second gate electrode 372 have different patterns.

The embodiments of the present disclosure further provide a display panel which includes the array substrate provided by any one of the above embodiments. Due to the characteristics of the array substrate, the display panel having the array substrate is provided with the driving TFT that has the better characteristics under PBTS condition, and is further provided with the switching TFT that has the better characteristics under NBITS condition, thereby improving the overall performance of the display panel.

The embodiments of the present disclosure further provide a display device which includes the display panel provided by any one of the above embodiments.

FIG. 4A is a flowchart illustrating a manufacturing method of an array substrate provided by an embodiment of the present disclosure. As illustrated in FIG. 4A, the method includes the following steps.

Step S41 includes forming a buffer layer on the base substrate. The base substrate includes a driving thin film transistor region and a switching thin film transistor region. The buffer layer contains oxygen. The buffer layer includes a first buffer part located in the driving thin film transistor region and a second buffer part located in the switching thin film transistor region. The first buffer part has a first thickness. The second buffer part has a second thickness. The second thickness is greater than the first thickness.

Step S42 includes forming a first semiconductor active layer of a driving TFT on the first buffer part, and forming the second semiconductor active layer of a switching TFT on the second buffer part.

Step S43 includes performing an annealing process on the base substrate on which the first buffer part, the second buffer part, the first semiconductor active layer and the second semiconductor active layer are formed.

FIG. 4B is a flowchart illustrating a manufacturing method of an array substrate provided by an embodiment of the present disclosure. As illustrated in FIG. 4B, the method includes the following steps.

Step S401 includes coating a buffer film layer that contains oxygen on the base substrate and coating a photoresist thin film on the buffer film layer.

Step S402 includes performing an exposure process, a development process on the photoresist thin film by a patterning process to form a photoresist-partially-removed part, a photoresist-completely-retained part and a photoresist-completely-removed region. The photoresist-partially-removed part is located in the driving thin film transistor region. The photoresist-completely-retained part is located in the switching thin film transistor region.

Step S403 includes removing a part of the buffer film layer under the photoresist-partially-removed part to form the first buffer part. The first buffer part has a first thickness.

Step S404 includes removing remaining photoresist of the photoresist-completely-retained part to form the second buffer part. The second buffer part has a second thickness, and the second thickness is greater than the first thickness.

For example, in the embodiments of the present disclosure, the patterning process includes a part or all of the processes that include a photoresist coating process, an exposure process on photoresist, a development process on photoresist, an etching process and a photoresist removing process.

For example, in the embodiments of the present disclosure, performing an exposure process on a photoresist thin film by a patterning process performing an exposure process on the photoresist thin film with a gray-tone mask or a half-tone mask. In the embodiments of the present disclosure, the gray-tone mask or the half-tone mask is adopted to perform the exposure process on the photoresist thin film, and only one exposure process is required. After the exposure process, forming a buffer layer having different thicknesses by a development process and a dry etching process, so that the manufacturing cost may be reduced.

The manufacturing method of the array substrate in the embodiments of the present disclosure will be described in detail below with reference to accompanying drawings.

Figure 5A:
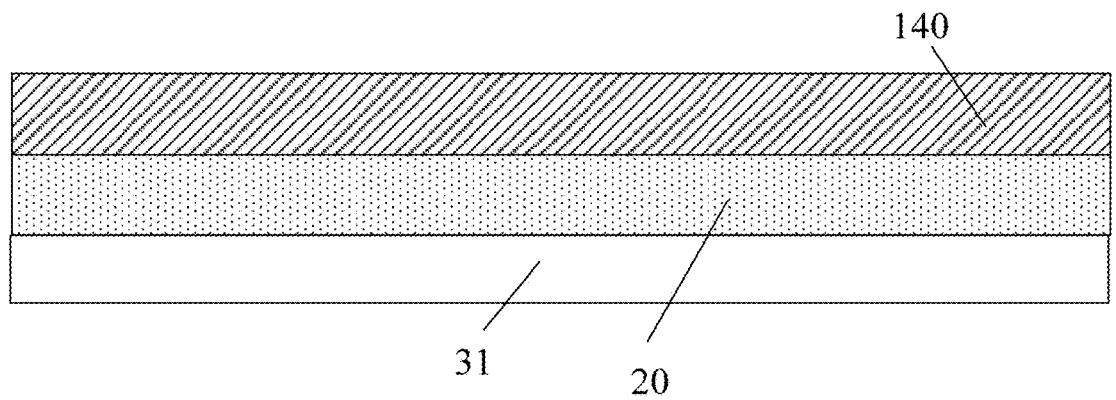
FIG. 5A is a schematic diagram illustrating coating a photoresist thin film on a buffer film layer in a manufacturing method of an array substrate provided by an embodiment of the present disclosure.

FIG. 5A is a schematic diagram illustrating coating a photoresist thin film on a buffer film layer in a manufacturing method of an array substrate provided by an embodiment of the present disclosure. As illustrated in FIG. 5A, the method includes coating a buffer film layer 20 that contains oxygen on the base substrate 31, and coating a photoresist thin film 140 on the buffer film layer 20.

For example, the buffer film layer 20 that contains oxygen includes SiOx. The photoresist thin film 140 may adopt positive photoresist or negative photoresist. The photoresist thin film 140 in the present embodiment is described by taking the positive photoresist as an example.

Figure 5B:
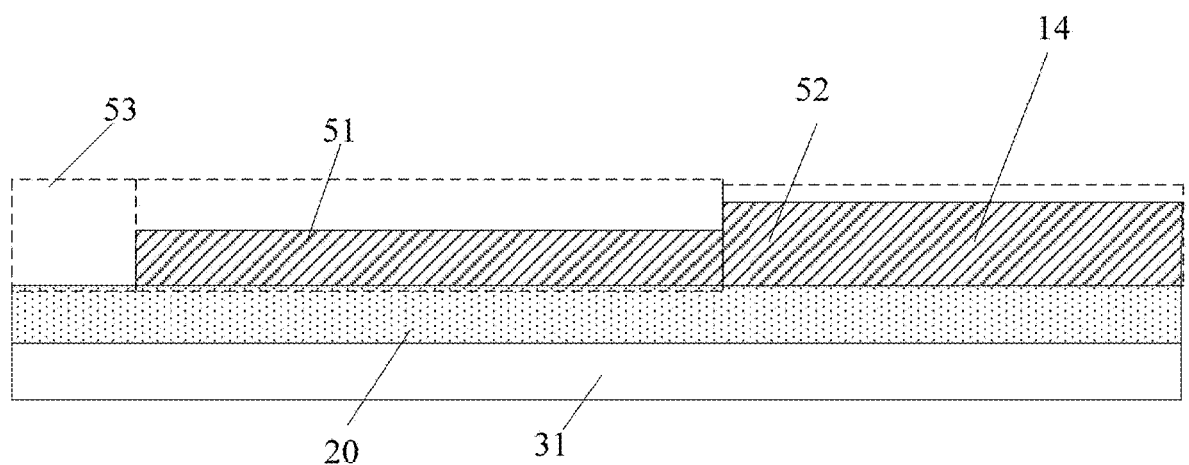
FIG. 5B is a structural diagram illustrating forming a photoresist layer on a buffer film layer in a manufacturing method of an array substrate provided by an embodiment of the present disclosure.

FIG. 5B is a structural diagram illustrating forming a photoresist layer on a buffer film layer in a manufacturing method of an array substrate provided by an embodiment of the present disclosure. As illustrated in FIG. 5B, the method includes patterning the photoresist thin film 140 to form a photoresist layer 14. As illustrated in FIG. 5B, the method includes performing an exposure process on the photoresist thin film 140 with a gray-tone mask or a half-tone mask, and performing a development process after the exposure process to form a photoresist-partially-removed part 51, a photoresist-completely-removed region 53 and a photoresist-completely-retained part 52. The photoresist-partially-removed part 51 and the photoresist-completely-retained part 52 constitute the photoresist layer 14. The photoresist-partially-removed part 51 is located in the driving thin film transistor region 33. The photoresist-completely-retained part 52 is located in the switching thin film transistor region 34. A position of the photoresist-completely-removed region 53 corresponds to other regions on the base substrate 1, such as corresponds to a region where a flexible printed circuit board is bonded.

The method further includes performing a first etching process on the buffer film layer 20 by taking the photoresist-partially-removed part 51 and the photoresist-completely-retained part 52 as a mask to remove a part of the buffer film layer 20 in the photoresist-completely-removed region 53.

Then, the method includes removing a part of the buffer film layer under the photoresist-partially-removed part 51 to form a first buffer part 321 having a first thickness Th1 at a position corresponding to the driving thin film transistor region 33, as illustrated in FIG. 3. For example, removing a part of the buffer film layer under the photoresist-partially-removed part 51 includes performing an ashing process on the photoresist-partially-removed part 51 and the photoresist-completely-retained part 52 to remove the photoresist-partially-removed part 51 and a part of the photoresist-completely-retained part 52, and performing a second etching process on the buffer film layer 20 with a remaining part of the photoresist-completely-retained part to remove a part of the buffer film layer corresponding to the photoresist-partially-removed part 51.

For example, the method includes removing the part of the buffer film layer under the photoresist-partially-removed part 51 by a dry etching process. During the dry etching process, it needs to adjust a thickness of the photoresist layer 14, a specific process condition of the dry etching, a thickness of the buffer film layer 20 to form the first buffer part 321 having the first thickness. The dry etching process may be referred to usual design and will not be described here.

Then, the method includes removing remaining photoresist of the photoresist-completely-retained part to form a second buffer part 322 having a second thickness at the position corresponding to the switching thin film transistor region 34, as illustrated in FIG. 3. Thus, the first buffer part 321 having the first thickness Th1 and the second buffer part 322 having the second thickness Th2 are obtained.

For example, a stripping process is used to remove the remaining photoresist of the photoresist-completely-retained part.

Figure 6:
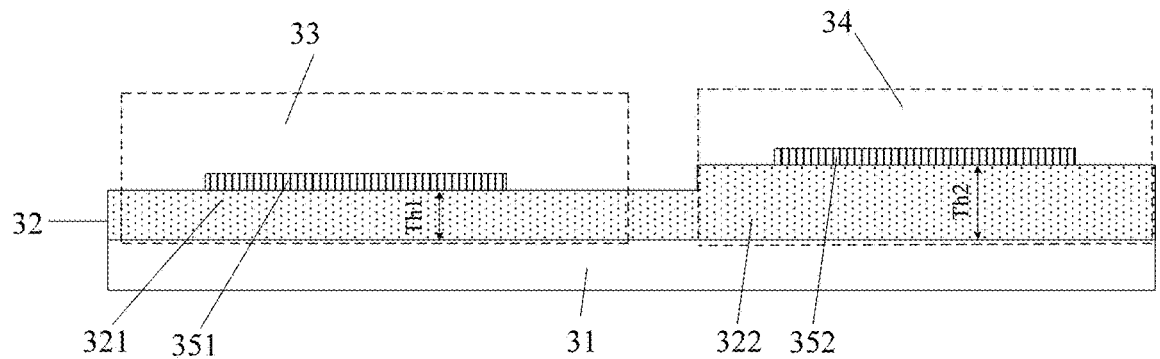
FIG. 6 is a structural diagram illustrating forming a first semiconductor active layer and a second semiconductor active layer on a buffer layer having different thicknesses respectively in a manufacturing method of an array substrate provided by an embodiment of the present disclosure.

FIG. 6 is a structural diagram illustrating forming a first semiconductor active layer and a second semiconductor active layer on the buffer layer with different thicknesses respectively in a manufacturing method of an array substrate provided by an embodiment of the present disclosure. As illustrated in FIG. 6, the method includes forming a first semiconductor active layer 351 and a second semiconductor active layer 352 on the first buffer part 321 having the first thickness and the second buffer part 322 by a patterning process, respectively. The process used to form first semiconductor active layer 351 and the second semiconductor active layer 352 may be referred to a common process, without repeated herein.

For example, as illustrated in FIG. 6, the first buffer part 321 and the second buffer part 322 constitute the buffer layer 32. For example, the first buffer part 321 and the second buffer part 322 are integrally formed.

Figure 7:
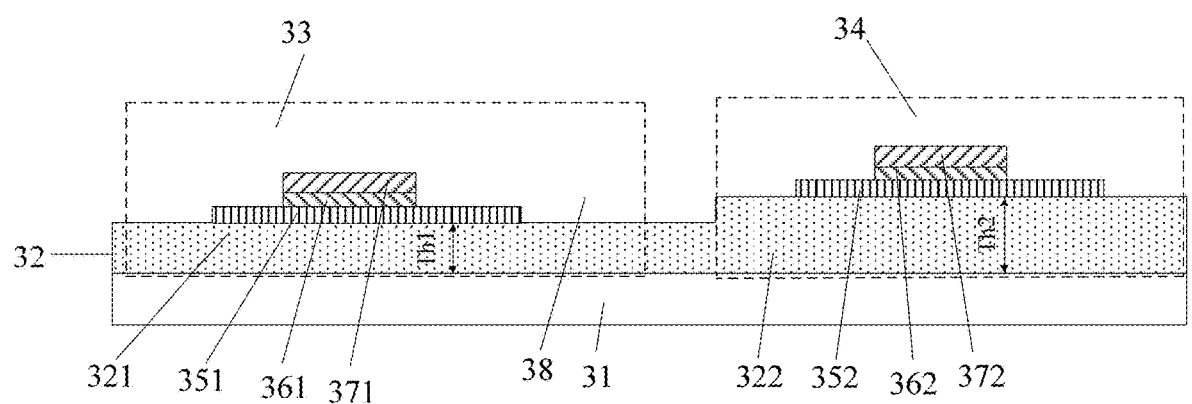
FIG. 7 is a structural diagram illustrating forming a first insulating layer and a first gate electrode on the first semiconductor active layer illustrated in FIG. 6, and forming a second insulating layer and a first gate electrode on the second semiconductor active layer illustrated in FIG. 6 in a manufacturing method of an array substrate provided by an embodiment of the present disclosure.

FIG. 7 is a structural diagram illustrating forming a first insulating layer and a first gate electrode on the first semiconductor active layer illustrated in FIG. 6, and forming a second insulating layer and a first gate electrode on the second semiconductor active layer illustrated in FIG. 6 in a manufacturing method of an array substrate provided by an embodiment of the present disclosure. As illustrated in FIG. 7, the method includes forming a first insulting part 361 and a first gate electrode 371 in sequence on the first semiconductor active layer 351 in the driving thin film transistor region 33 by a patterning process, and forming a second insulting part 362 and a second gate electrode 372 in sequence on the second semiconductor active layer 352 in the switching thin film transistor region 34 by a patterning process. The manufacturing process may be referred to a common process, without repeated herein.

Figure 8:
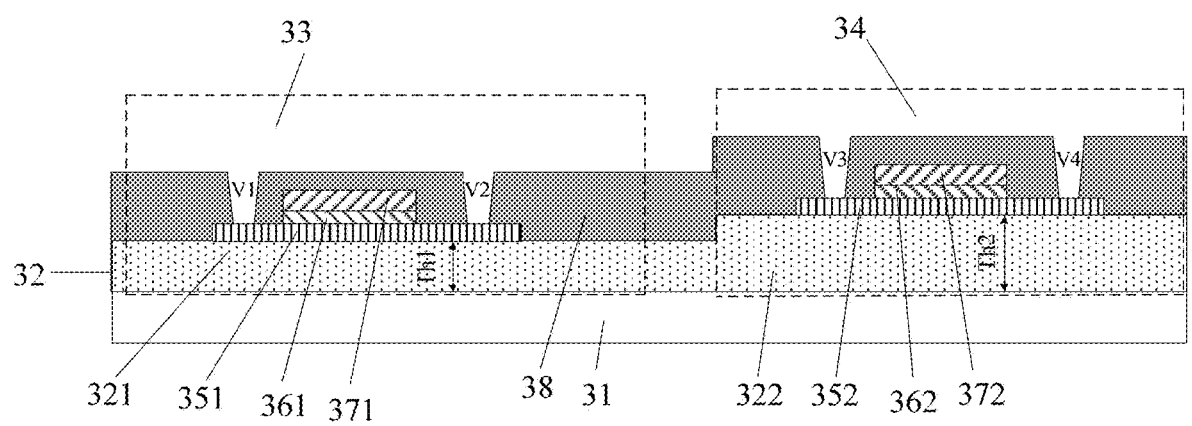
FIG. 8 is a schematic diagram illustrating forming via holes in an interlayer insulating thin film layer to form an interlayer insulating layer in a manufacturing method of an array substrate provided by an embodiment of the present disclosure.

FIG. 8 is schematic diagram illustrating forming via holes in an interlayer insulating thin film layer to form an interlayer insulating layer in a manufacturing method of an array substrate provided by an embodiment of the present disclosure. As illustrated in FIG. 8, the method includes forming an interlayer insulating layer 38 on the first gate electrode 371 and the second gate electrode 372 illustrated in FIG. 7 by a patterning process, forming a first via hole V1 and a second via hole V2 that penetrate the interlayer insulating layer 38 at positions corresponding to the first semiconductor active layer 351 in the interlayer insulating layer 38, respectively, and forming a third via hole V3 and a fourth via hole V4 that penetrate the interlayer insulating layer 38 at positions corresponding to the second semiconductor active layer 352, respectively. A part of the first semiconductor active layer 351 is exposed through the first via hole V1 and the second via hole V2. A part of the second semiconductor active layer 352 is exposed through the third via hole V3 and the fourth via hole V4. The manufacturing process of the interlayer insulating thin film layer and the interlayer insulating layer 38 may be referred to a common process, without repeated herein.

Finally, the method includes forming a first source electrode 391, a first drain electrode 3101, a second source electrode 392, and a second drain electrode 3102 on the interlayer insulating layer 38 illustrated in FIG. 8 by a patterning process to form the structure illustrated in FIG. 3. The first source electrode 391 is electrically connected with the first semiconductor active layer 351 through the first via hole V1 that penetrates the interlayer insulating layer 38. The first drain electrode 3101 is electrically connected with the first semiconductor active layer 351 through the second via hole V2 that penetrates the interlayer insulating layer 38. The manufacturing process of the first source electrode 391, the first drain electrode 3101, the second source electrode 392, and the second drain electrode 3102 may be referred to a common process, without repeated herein.

In the manufacturing method provided by the embodiments of the present disclosure further includes an annealing process. For example, the annealing process may be performed after forming the first buffer part 321, the second buffer part 322, the first semiconductor active layer 351, and the second semiconductor active layer 352.

Further referring to FIG. 3, because the first thickness Th1 of the first buffer part 321 is thin, the oxygen content of the first buffer part 321 having the first thickness is less, which is advantageous to obtain the driving TFT 301 located in the driving thin film transistor region 33 that has a better characteristic under PBTS condition. At the same time, because the second thickness Th2 of the second buffer part 322 is thick, the oxygen content of the second buffer part 322 is large, which is advantageous to obtain the switching TFT 302 located in the switching thin film transistor region 34 that has a better characteristic under NBITS condition.

With the manufacturing method provided by the embodiments of the present disclosure, the driving TFT having a better characteristic under PBTS condition can be obtained, and the switching TFT having a better characteristic under NBITS condition can further be obtained on the same buffer layer having different thicknesses. In addition, because the buffer layer with different thicknesses is formed by only performing one exposure process with the gray-tone mask or the half-tone mask, the difficulty in manufacturing the array substrate is greatly reduced, and the manufacturing cost is reduced.

The beneficial effects obtained by applying the embodiments of the present disclosure include at least one of the following.

1. In the array substrate provided by the embodiments of the present disclosure, because a part of the buffer layer in the driving thin film transistor region and a part of the buffer layer in the switching thin film transistor region have different thicknesses, the buffer layer is a buffer layer containing oxygen, and the thicker the thickness of the buffer layer is, the higher the oxygen content is. Because a part of the buffer layer in the driving thin film transistor region has the first thickness, and a part of the buffer layer in the switching thin film transistor region has the second thickness, the second thickness is greater than the first thickness, that is, in the array substrate provided by the embodiments of the present disclosure, a part of the buffer layer in the driving TFT region has less oxygen content, and a part of the buffer layer in the switching TFT region has large oxygen content. Compared with the substrate array illustrated in FIG. 1, the array substrate provided by the embodiments of the present disclosure can achieve that the array substrate has better display effect, and can further provide better control performance. The overall performance of the array substrate is improved.

2. The embodiments of the present disclosure may use a gray-tone mask or a half-tone mask to perform an exposure process on the photoresist thin film coated on the buffer film layer containing oxygen. Only one exposure process is required. After that, the buffer layer having different thicknesses can be formed by a development process and a dry etching process. The difficulty in manufacturing the array substrate is greatly reduced, and the manufacturing cost is reduced.

The above are merely specific implementations of the present disclosure without limiting the protection scope of the present disclosure thereto. Any changes or substitutions easily occur to those skilled in the art within the technical scope of the present disclosure should be covered in the protection scope of the present disclosure. Therefore, the protection scope of the present disclosure should be based on the protection scope of the appended claims.

What is claimed is:

1. A manufacturing method of an array substrate, comprising:

forming a buffer layer on a base substrate, wherein the base substrate comprises a driving thin film transistor region and a switching thin film transistor region, the buffer layer contains oxygen, the buffer layer comprises a first buffer part located in the driving thin film transistor region and a second buffer part located in the switching thin film transistor region, the first buffer part has a first thickness, the second buffer part has a second thickness, and the second thickness is greater than the first thickness;

forming a first semiconductor active layer of a driving thin film transistor on the first buffer part, and forming a second semiconductor active layer of a switching thin film transistor on the second buffer part; and performing an annealing process on the base substrate on which the first buffer part, the second buffer part, the first semiconductor active layer, and the second semiconductor active layer are formed, wherein the forming the buffer layer on the base substrate comprises:

coating a buffer film layer on the base substrate, coating a photoresist thin film on the buffer film layer;

performing an exposure process and a development process on the photoresist thin film by a patterning process to form a photoresist-partially-removed part, a photoresist-completely-retained part, and a photoresist-completely-removed region; the photoresist-partially-removed part being located in the driving thin film transistor region, the photoresist-completely-retained part being located in the switching thin film transistor region;

removing a part of the buffer film layer under the photoresist-partially-removed part to form the first buffer part; and removing remaining photoresist of the photoresist-completely-retained part to form the second buffer part.

2. The manufacturing method according to claim 1, wherein the performing the exposure process on the photoresist thin film by the patterning process comprises:

performing the exposure process on the photoresist thin film with a gray-tone mask or a half-tone mask.

3. The manufacturing method according to claim 2, wherein the removing the part of the buffer film layer under the photoresist-partially-removed part comprises:

performing a first etching process on the buffer film layer by using the photoresist-completely-retained part and the photoresist-partially-removed part as a mask;

performing an ashing process on the photoresist-completely-retained part and the photoresist-partially-removed part to remove a part of the photoresist-completely-retained part and to remove the photoresist-partially-removed part; and performing a second etching process on the buffer film layer by using a remaining part of the photoresist-completely-retained part as a mask to remove a part of the buffer film layer to form the first buffer part.

4. The manufacturing method according to claim 1, further comprising:

forming a first insulating part, a first gate electrode, a first source electrode, and a first drain electrode of the driving thin film transistor that are located at a side of the first semiconductor active layer away from the base substrate;

forming a second insulating part, a second gate electrode, a second source electrode, and a second drain electrode of the switching thin film transistor that are located at a side of the second semiconductor active layer away from the base substrate;

forming an interlayer insulating layer and forming a first via hole, a second via hole, a third via hole, and a fourth via hole that penetrate the interlayer insulating layer, wherein the interlayer insulating layer is located between any two of the first gate electrode, the first source electrode, and the first drain electrode, and is located between any two of the second gate electrode, the second source electrode, and the second drain electrode; the first source electrode and the first drain electrode are connected with the first semiconductor active layer through the first via hole and the second via hole, respectively; and the second source electrode and the second drain electrode are connected with the second semiconductor active layer through the third via hole and the fourth via hole, respectively.

* * * * *